(12) United States Patent
Im et al.

(10) Patent No.: US 11,037,913 B2
(45) Date of Patent: Jun. 15, 2021

(54) SEMICONDUCTOR PACKAGE

(71) Applicant: SAMSUNG ELECTRONICS CO., LTD., Suwon-si (KR)

(72) Inventors: Yunhyeok Im, Hwaseong-si (KR); Kyoung-Min Lee, Yongin-si (KR); Kyungsoo Lee, Yongin-si (KR); Horang Jang, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/854,971

(22) Filed: Apr. 22, 2020

(65) Prior Publication Data

US 2020/0251455 A1 Aug. 6, 2020

Related U.S. Application Data

(62) Division of application No. 16/056,709, filed on Aug. 7, 2018, now Pat. No. 10,665,574.

(30) Foreign Application Priority Data

Jan. 23, 2018 (KR) ........................ 10-2018-0008128

(51) Int. Cl.
  *H01L 25/10* (2006.01)
  *H01L 23/367* (2006.01)
  (Continued)

(52) U.S. Cl.
  CPC .......... *H01L 25/105* (2013.01); *H01L 23/367* (2013.01); *H01L 23/42* (2013.01); *H01L 23/49822* (2013.01); *H01L 23/49827* (2013.01); *H01L 23/49838* (2013.01); *H01L 23/5385* (2013.01); *H01L 23/5389* (2013.01); *H01L 23/552* (2013.01); *H01L 23/49811* (2013.01); *H01L 24/13* (2013.01); *H01L 24/16* (2013.01); *H01L 2224/0401* (2013.01); *H01L 2224/04042* (2013.01); *H01L 2224/04105* (2013.01); *H01L 2224/12105* (2013.01); *H01L 2224/131* (2013.01); *H01L 2224/16227* (2013.01); *H01L 2224/32225* (2013.01);
  (Continued)

(58) Field of Classification Search
  CPC ................. H01L 25/105; H01L 23/367; H01L 23/49822; H01L 23/49838; H01L 23/49827; H01L 23/42; H01L 23/552; H01L 24/13
  USPC ........ 257/668, 675, 686, 723; 438/109, 123, 438/124
  See application file for complete search history.

(56) References Cited

U.S. PATENT DOCUMENTS 8,125,066 B1   2/2012   Kang
8,981,554 B2   3/2015   Kim
(Continued)

*Primary Examiner* — Thinh T Nguyen
(74) *Attorney, Agent, or Firm* — Volentine, Whitt & Francos, PLLC

(57) ABSTRACT

A semiconductor package includes a bottom package having a lower substrate and a lower semiconductor chip mounted on the lower substrate, an interposer substrate on the bottom package, a first top package and a second top package that are mounted on the interposer substrate, and a heat spreader that is interposed between the first top package and the second top package and separates the first and second top packages from each other. The heat spreader is adhered to the interposer substrate through a plurality of first connection terminals.

7 Claims, 20 Drawing Sheets

(51) Int. Cl.
*H01L 23/498* (2006.01)
*H01L 23/42* (2006.01)
*H01L 23/552* (2006.01)
*H01L 23/538* (2006.01)
*H01L 23/00* (2006.01)

(52) U.S. Cl.
CPC ........... *H01L 2224/48227* (2013.01); *H01L 2224/73253* (2013.01); *H01L 2224/73267* (2013.01); *H01L 2225/1023* (2013.01); *H01L 2225/1035* (2013.01); *H01L 2225/1041* (2013.01); *H01L 2225/1058* (2013.01); *H01L 2225/1094* (2013.01); *H01L 2924/00014* (2013.01); *H01L 2924/1431* (2013.01); *H01L 2924/1434* (2013.01); *H01L 2924/1436* (2013.01); *H01L 2924/15311* (2013.01); *H01L 2924/15331* (2013.01); *H01L 2924/181* (2013.01); *H01L 2924/18161* (2013.01); *H01L 2924/3025* (2013.01)

(56) References Cited

U.S. PATENT DOCUMENTS

| | | |
|---|---|---|
| 9,391,009 B2 | 7/2016 | Jang et al. |
| 9,502,342 B2 | 11/2016 | Kim |
| 9,553,071 B1 | 1/2017 | Haba |
| 9,583,430 B2 | 2/2017 | Park et al. |
| 2008/0308950 A1 | 12/2008 | Yoo et al. |
| 2013/0093074 A1 | 4/2013 | Grant |
| 2016/0276308 A1 | 9/2016 | Min et al. |
| 2017/0092619 A1* | 3/2017 | Refai-Ahmed et al. ................... H01L 23/373 |
| 2018/0174943 A1 | 6/2018 | Kinsley |

* cited by examiner

SEMICONDUCTOR PACKAGE

PRIORITY STATEMENT

This is a Divisional of U.S. application Ser. No. 16/056,709, filed Aug. 7, 2018, which claims the benefit of priority under 35 U.S.C § 119 to Korean Patent Application No. 10-2018-0008128 filed on Jan. 23, 2018, in the Korean Intellectual Property Office, the entire contents of which are hereby incorporated by reference.

BACKGROUND

The inventive concept relates to multi-chip semiconductor device packages such as package on package (PoP) devices.

The electronics industry has recently been moving to smaller and thinner printed circuit boards with the rapid development of thinner, lighter, and smaller electronic products having higher packing density. Together with portability of electronic devices, multi-functionality and mass data transceiving functions necessitate complicated printed circuit board designs. As a result, there has been increased needs for multi-layered printed circuit boards including power supply circuits, ground circuits, signal circuits, etc. formed thereon.

A variety of semiconductor chips, such as central processing units and power integrated circuits, are mounted on multi-layered printed circuit boards. Such semiconductor chips generate high temperatures when they are operated. The heat may cause semiconductor chips to suffer from overload that leads to malfunctions thereof.

When many semiconductor chips are mounted on a printed circuit board, electromagnetic interference (EMI) may be generated between the semiconductor chips. Such electromagnetic interference may also induce malfunctions of semiconductor chips.

SUMMARY

According to an aspect of the present inventive concept, there is provided a semiconductor package comprising a bottom package including a lower package substrate and a lower semiconductor chip mounted on the lower package substrate, an interposer on the bottom package, a first top package and a second top package mounted on the interposer, a heat spreader interposed between respective lateral surfaces of the first top package and the second top package, and a plurality of first connection terminals adhering the heat spreader to the interposer. The heat spreader separates the first and second top packages from each other.

According to another aspect of the present inventive concept, there is provided a semiconductor package comprising a bottom package including a lower package substrate and a semiconductor chip mounted on the lower package substrate, an interposer on the bottom package, the interposer having a first region and a second region laterally spaced apart from each other, a first top package on the first region of the interposer, a first heat spreader covering a top surface the first top package and surrounding lateral surfaces of the first top package, a second top package on the second region of the interposer, and a second heat spreader covering the second top package and surrounding lateral surfaces of the second top package.

According to another aspect of the present inventive concept, there is provided a semiconductor package comprising a bottom package including a lower package substrate and a lower semiconductor chip mounted on the lower package substrate, an interposer body on the bottom package and having a first region and a second region disposed laterally of the first region, a first plurality of conductive pads on the first region of the interposer body and a second plurality of conductive pads on the second region of the interposer body, a first top package disposed on the first region of the interposer body, a second top package disposed on the second region of the interposer body so as to be spaced laterally from the first top package, and heat distribution structure disposed on the interposer body. The first top package includes a first upper package substrate electrically connected to the first plurality conductive pads and a first upper electronic component mounted on and electrically connected to the first upper package substrate. The second top package includes a second upper package substrate electrically connected to the second plurality of conductive pads and a second upper electronic component mounted on and electrically connected to the second upper package substrate. The heat distribution structure comprises at least one partition extending upright on the interposer body as interposed between respective inwardly facing lateral surfaces of the first top package and the second top package. The at least one partition extends to at least a level equal to a highest level of the first and second top packages so as to separate the first and second top packages from each other on the interposer body. Accordingly, heat generated by the lower semiconductor chip and absorbed by the interposer body is transferred by the at least one partition upwardly from the interposer body to a level in the semiconductor package at least equal to the highest level of the first and second top packages.

DETAILED DESCRIPTION

Semiconductor packages according to the inventive concept will now be described with reference to accompanying drawings.

Figure 1:
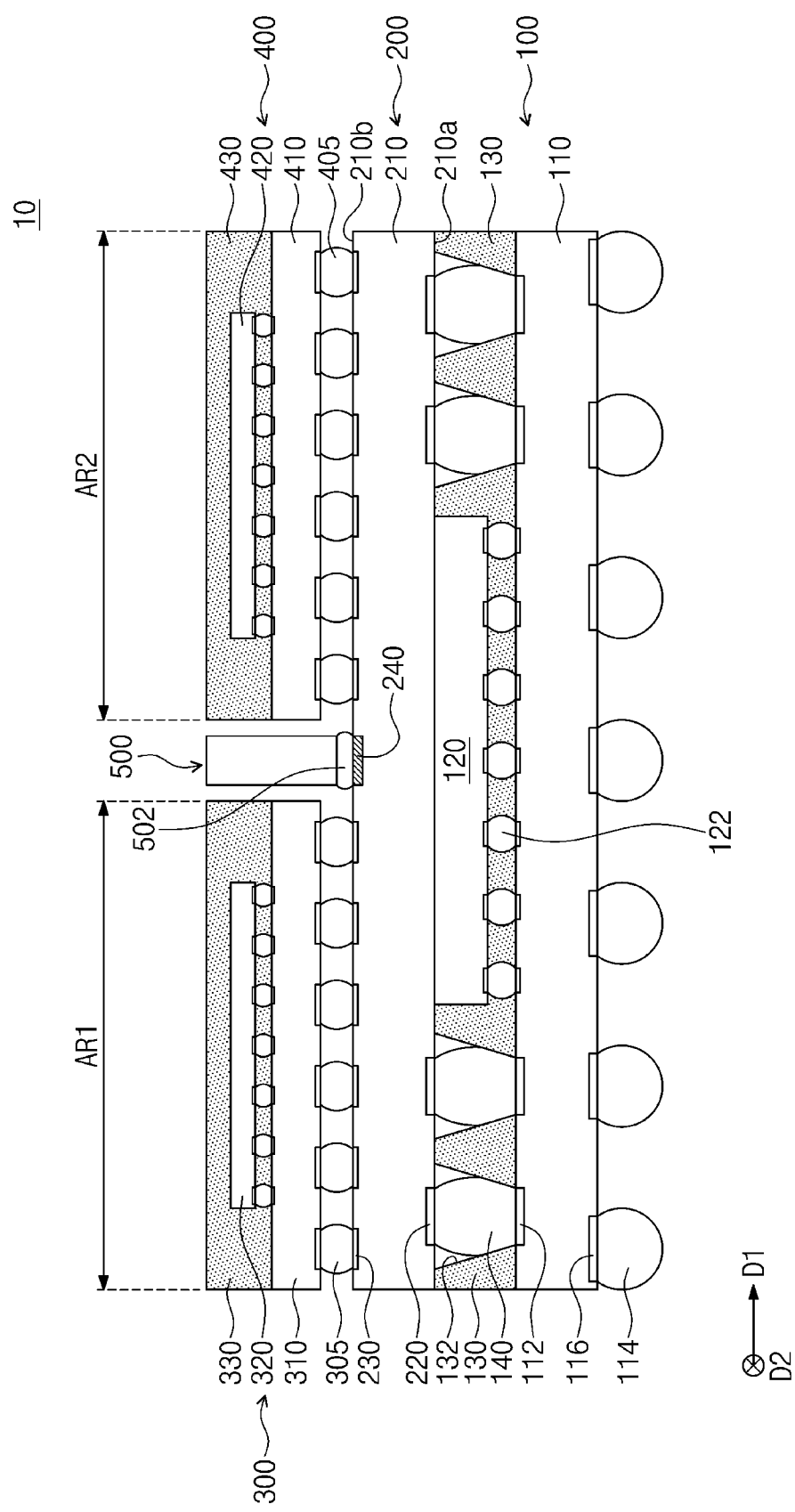
FIG. 1 is a cross-sectional view of an example of a semiconductor package according to the present inventive concepts.
Figure 2:
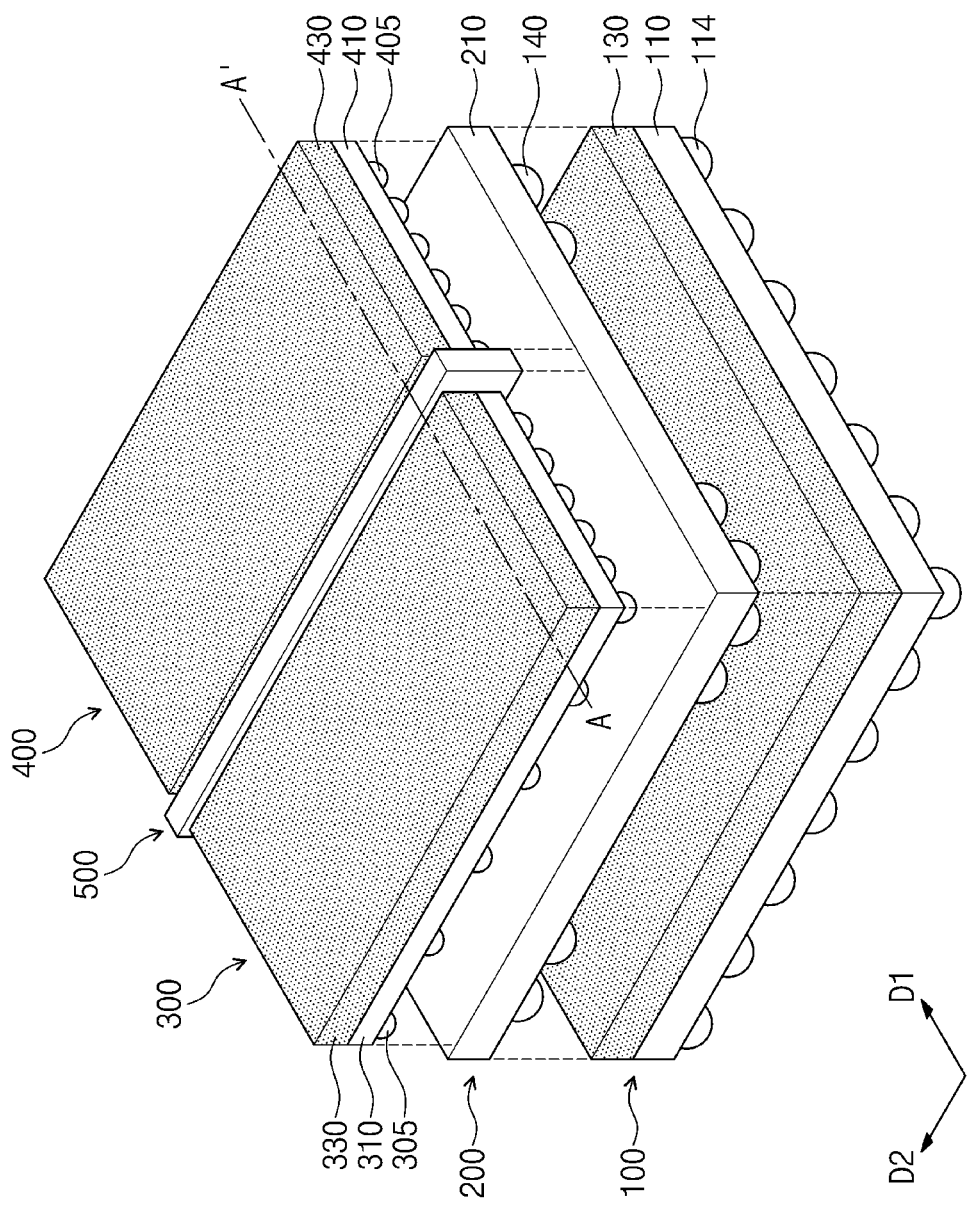
FIG. 2 is an exploded perspective view of the semiconductor package according to the present inventive concept.

FIG. 1 is a cross-sectional view of an example of a semiconductor package 10 according to the present inventive concept. FIG. 2 is an exploded perspective view taken along line A-A' of FIG. 1, with some components of the semiconductor package omitted.

Referring to FIGS. 1 and 2, a bottom package 100 may be provided. The bottom package 100 may include a lower package substrate 110 and a lower semiconductor chip 120 mounted on the lower package substrate 110.

The lower package substrate 110 may be or include a printed circuit board (PCB) comprising an insulation board (substrate body) provided with signal patterns at its top surface. Alternatively, the lower package substrate 110 may be a multi-layered printed circuit board having a structure in which at least one insulation layer (together constituting a substrate body) and at least one wiring line layer are alternately stacked. The lower package substrate 110 may include at its top surface at least one lower substrate pad 112.

A plurality of external terminals 114 may be disposed below the lower package substrate 110. For example, the external terminals 114 may be disposed on terminal pads 116 provided at a bottom surface of the lower package substrate 110. The external terminals 114 may include solder balls or solder pads, and the semiconductor package 10 may be a ball grid array (BGA) type, a fine ball grid array (FBGA) type, or a land grid array (LGA) type of package, based on the type and arrangement of external terminals 114 provided. The external terminals 114 may be electrically connected through the lower package substrate 110 to the lower substrate pads 112. In this description, the phrase "electrically connected/coupled" includes directly or indirectly electrically connected/coupled.

The lower semiconductor chip 120 may be mounted on the top surface of the lower package substrate 110. The lower semiconductor chip 120 may be flip-chip mounted on the lower package substrate 110. For example, the lower semiconductor chip 120 may be electrically connected to the lower package substrate 110 through lower chip terminals 122 such as solder balls or solder bumps. The inventive concept, however, is not limited thereto; for example, the lower semiconductor chip 120 may be electrically connected to the lower package substrate 110 through bonding wires (not shown). The lower semiconductor chip 120 may be, for example, a logic chip or a memory chip. The logic chip may include a logic part and a memory part. Examples of the memory chip include a DRAM, NAND flash, NOR flash, PRAM, ReRAM, and MRAM. The lower semiconductor chip 120 may be electrically connected to the external terminals 114. FIG. 1 shows that a single lower semiconductor chip 120 is included, but instead a plurality of lower semiconductor chips 120 of the same or different types may be provided.

The lower package substrate 110 may be provided thereon with a lower mold layer 130 encapsulating the lower semiconductor chip 120. For example, the lower mold layer 130 may be provided to expose a top surface of the lower semiconductor chip 120, or differently from that shown, the lower mold layer 130 may be provided to cover the top surface of the lower semiconductor chip 120. In addition, the lower mold layer 130 may include connection holes 132 extending therethrough. The connection holes 132 may expose the lower substrate pads 112. The connection holes 132 may be spaced apart from the lower semiconductor chip 120. The lower mold layer 130 may include an insulating polymeric material such as epoxy molding compound (EMC).

First connection terminals 140 may be provided in the connection holes 132 in contact with the lower package substrate 110. The first connection terminals 140 may be disposed on the top surface of the lower package substrate 110 as coupled to the lower substrate pads 112 provided at the top surface of the lower package substrate 110. The first connection terminals 140 may be electrically connected with the lower package substrate 110 and the lower semiconductor chip 120.

An interposer 200 may be provided on the bottom package 100. For example, the interposer 200 may be disposed on the lower semiconductor chip 120 and the lower mold layer 130. The interposer 200 may have a bottom surface 210a in contact with the top surface of the lower semiconductor chip 120 and a top surface of the lower mold layer 130. The interposer 200 may have a first region and a second region that are spaced apart from each other. The interposer 200 may include a base layer 210 which may be referred to as an interposer body, a first circuit pattern 220 on a bottom surface 210a of the base layer 210 (which bottom surface 210a is substantially the same as the bottom surface of the interposer 200), and second and third circuit patterns 230 and 240 on a top surface 210b of the base layer 210 (which top surface 210b is substantially the same as a top surface of the interposer 200). The first circuit pattern 220 may be coupled to the first connection terminals 140. The second circuit pattern 230 and the third circuit pattern 240 may be disposed at the top surface 210b of the interposer 200, i.e., on a top surface of the base layer 210. The second and third circuit patterns 230 and 240 may be electrically insulated from each other. The first circuit pattern 220 may be electrically connected to the second circuit pattern 230 through an internal circuit of the interposer 200, and may be electrically insulated from the third circuit pattern 240. The third circuit pattern 240 may be electrically connected to a ground circuit of the interposer 200.

First and second top packages 300 and 400 may be mounted on the second circuit pattern 230. A heat spreader 500 (described in more detail later on) may be mounted on the third circuit pattern 240. The second and third circuit patterns 230 and 240 of the interposer 200 will now be discussed in detail below with reference to FIGS. 3 and 4.

Figure 3:
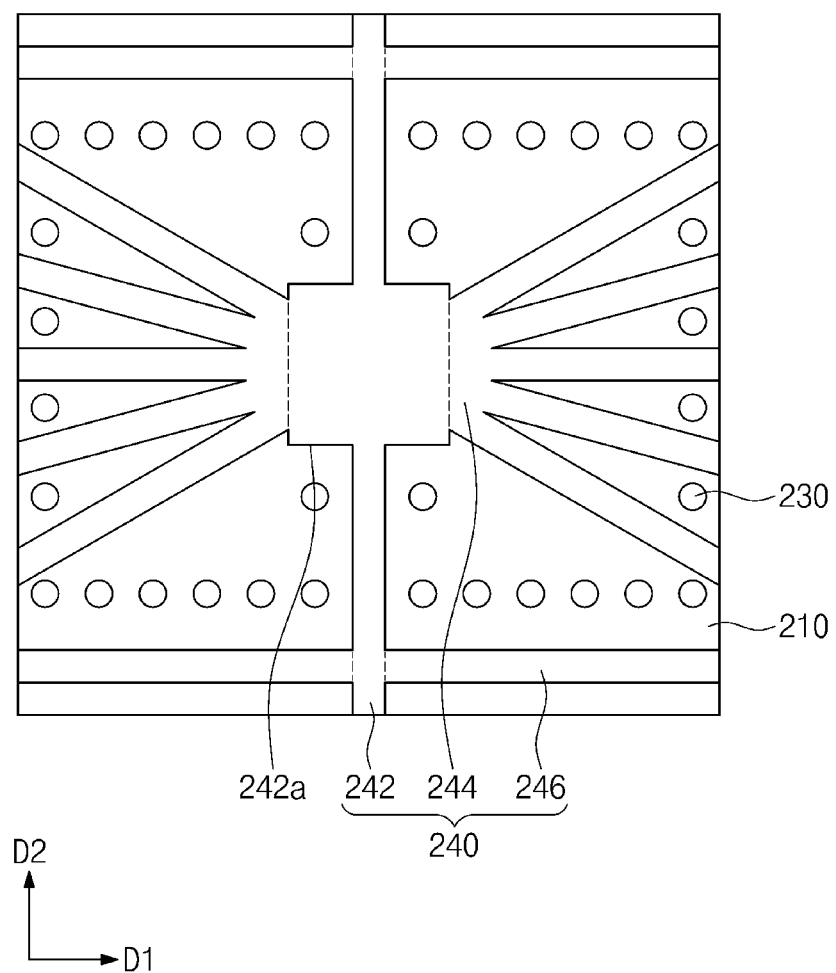
FIGS. 3 and 4 are plan views of examples of an interposer substrate.
Figure 4:
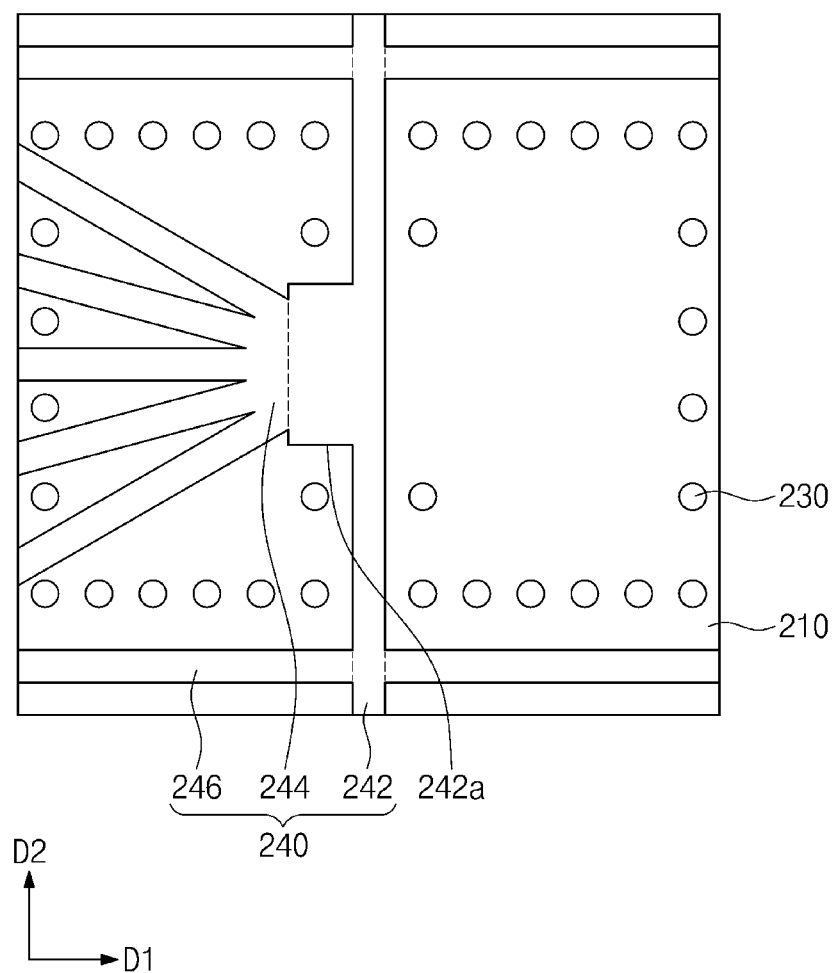

FIGS. 3 and 4 are plan views of respective examples of the interposer substrate. FIGS. 3 and 4 provided to show exemplary circuit patterns, i.e., the inventive concept is not limited to the circuit patterns shown in FIGS. 3 and 4.

Referring to FIGS. 1 and 3, the third circuit pattern 240 or simply "conductive pattern" may include a first part 242 on which the heat spreader 500 is mounted and a second part 244 extending from the first part 242. The first part 242 may extend in a second direction D2. The second part 244 may extend from a central portion of the base layer 210 the interposer 200 toward an outer peripheral portion of the base layer 210 of the interposer 200. For example, the second part 244 may extend either in a first direction D1 from an intermediate portion 242a of the first part 242 or obliquely relative to the first direction D1. For example, when viewed in plan, the second part 244 may extend from the first part 242 toward the perimeter of the interposer 200. The second part 244 may have a planar shape that radially extends from the first part 242. The interposer 200 may receive a larger amount of heat at its central portion than at its peripheral portion, which heat is generated in the lower semiconductor chip 120 overlapping the central portion of the interposer 200 when viewed in plan, and the second part 244 may transfer the heat of the central portion of the interposer 200 to outside the interposer 200. The third circuit pattern 240 may further include a third part 246 formed along an outer periphery of the interposer 200. FIG. 3 shows that the third part 246 extends in the first direction D1 from opposite ends of the first part 242, but the inventive concept is not limited thereto.

In another example, referring to FIGS. 1 and 4, the second part 244 is disposed only on one side of the first part 242. For example, the second part 244 may be disposed only below the first top package 300 which will be discussed in detail below. When the first top package 300 generates heat whose amount is greater than that generated in the second top package 400, the second part 244 may prevent heat from being transferred from the first top package 300 to the second top package 400 and may dissipate heat from the first top package 300 to outside the interposer 200.

Referring back to FIGS. 1 and 2, the first and second top packages 300 and 400 may be disposed on the interposer 200. The first and second top packages 300 and 400 may be spaced apart from each other in the first direction D1. The first and second top packages 300 and 400 may be individually mounted on the interposer 200. For example, the first top package 300 may be mounted on a first area AR1 of the base layer 210 of the interposer 200 containing a first plurality of conductive pads constituting the second circuit pattern 230, and the second top package 400 may be mounted on a second area AR2 of the base layer 210 of the interposer 200 containing a second plurality of conductive pads constituting the second circuit pattern 230.

The first top package 300 may be electrically connected through first upper contact terminals 305 to the second circuit pattern 230 of the interposer 200, and the second top package 400 may be electrically connected through second upper contact terminals 405 to the second circuit pattern 230 of the interposer 200.

The first top package 300 may include a first upper package substrate 310, a first upper semiconductor chip 320, and a first upper mold layer 330. The first upper package substrate 310 may be or include a printed circuit board (PCB). The first upper semiconductor chip 320 may be flip-chip mounted or wire-bonding mounted to the top of the first upper package substrate 310. The first upper semiconductor chip 320 may be a logic chip or a memory chip. The first upper mold layer 330 may be disposed on the first upper package substrate 310, encapsulating the first upper semiconductor chip 320. The first upper mold layer 330 may include an insulating polymeric material such as epoxy molding compound (EMC).

The second top package 400 may include a second upper package substrate 410, a second upper semiconductor chip 420, and a second upper mold layer 430. The second upper package substrate 410 may be or include a printed circuit board (PCB). The second upper semiconductor chip 420 may be flip-chip mounted or wire-bonding mounted to the top of the second upper package substrate 410. The second upper semiconductor chip 420 may be a logic chip or a memory chip. The second upper mold layer 430 may be disposed on the second upper package substrate 410, encapsulating the second upper semiconductor chip 420. The second upper mold layer 430 may include an insulating polymeric material such as epoxy molding compound (EMC).

The heat spreader 500 may be disposed between the first and second top packages 300 and 400. The heat spreader 500 may have a partition wall shape that divides the first area AR1 and the second area AR2 from each other. When viewed in plan, the heat spreader 500 may extend in the second direction D2 to separate the first top package 300 and the second top package 400 from each other. The heat spreader 500 may include a metallic material having high thermal conductivity. The interposer 200 may receive a larger amount of heat at its central portion than at its peripheral portion during operation of the semiconductor package 10, which heat is generated in the lower semiconductor chip 120 overlapping the central portion of the interposer 200 when viewed in plan, and the heat of the central portion of the interposer 200 may be absorbed by the heat spreader 500 and then discharged outside the semiconductor package 10.

The heat spreader 500 may be mounted on the interposer 200 through second connection terminals 502. For example, the second connection terminals 502 may electrically connect the heat spreader 500 to the third circuit pattern 240 of the interposer 200, and may rigidly adhere the heat spreader 500 to the interposer 200. The second connection terminals 502 may include solder balls or solder bumps. In some examples, a conductive adhesion pattern is provided instead of the second connection terminals 502. The conductive adhesion pattern may include a material having high thermal conductivity. For example, the conductive adhesion pattern may include a thermal interface material (TIM) such as thermal grease.

The bottom package 100 may be mounted on the interposer 200 in such a way that the top surface of the lower semiconductor chip 120 contacts the bottom surface 210a of the interposer 200. The interposer 200 may include therein conductive lines for electrical connection, and heat generated in the lower semiconductor chip 120 may be delivered to the first and second top packages 300 and 400 through the conductive lines of the interposer 200 that have high thermal conductivity. The first and second upper package substrates 310 and 410 and the first and second upper mold layers 330 and 430 may include an insulating material having low thermal conductivity. In such a configuration, if a large amount of heat were delivered to the first and second top packages 300 and 400, the heat would tend to accumulate between the first and second upper package substrates 310 and 410 and the first and second upper mold layers 330 and 430, and the first and second upper semiconductor chips 320 and 420 would potentially be damage by the heat.

However, according to an aspect of the inventive concept, the heat spreader 500 constitutes heat distribution structure that distributes heat transferred to the interposer 200. For example, when heat is generated in the lower semiconductor chip 120, the heat absorbed by the interposer 200 may be transferred by the heat spreader 500 having high thermal conductivity including to a level at least equal to the highest level of the first and second top packages 300 and 400 where the heat may dissipate from the package 10. Also, the third circuit pattern 240 may also constitute the heat distribution structure and may serve to transfer heat generated by the lower semiconductor chip 120 and absorbed by the base layer 210 of the interposer 200 radially outwardly to the periphery of the interposer where the heat may dissipate from the package 10. The semiconductor package 10 is highly efficient in terms of its heat dissipation, which characteristic means that the amount of heat delivered to the first and second top packages 300 and 400 is minimized to prevent the first and second upper semiconductor chips 320 and 420 from being damaged. That is, the semiconductor package 10 has a high degree of thermal stability.

Furthermore, according to another aspect of the inventive concept, the heat spreader 500 may shield the first and second top packages 300 and 400 from each other and thereby prevent electromagnetic interference (EMI) between the first and second top packages 300 and 400. For example, the heat spreader 500 made of a metallic material may shield electromagnetic waves that are released from inside the first and second top packages 300 and 400 which could otherwise interfere with each other. The electromagnetic waves may be absorbed by the heat spreader 500 and then be dispersed radially outwardly through a ground circuit of the interposer 200. The semiconductor package 10 may therefore exhibit excellent electrical characteristics.

Figure 5:
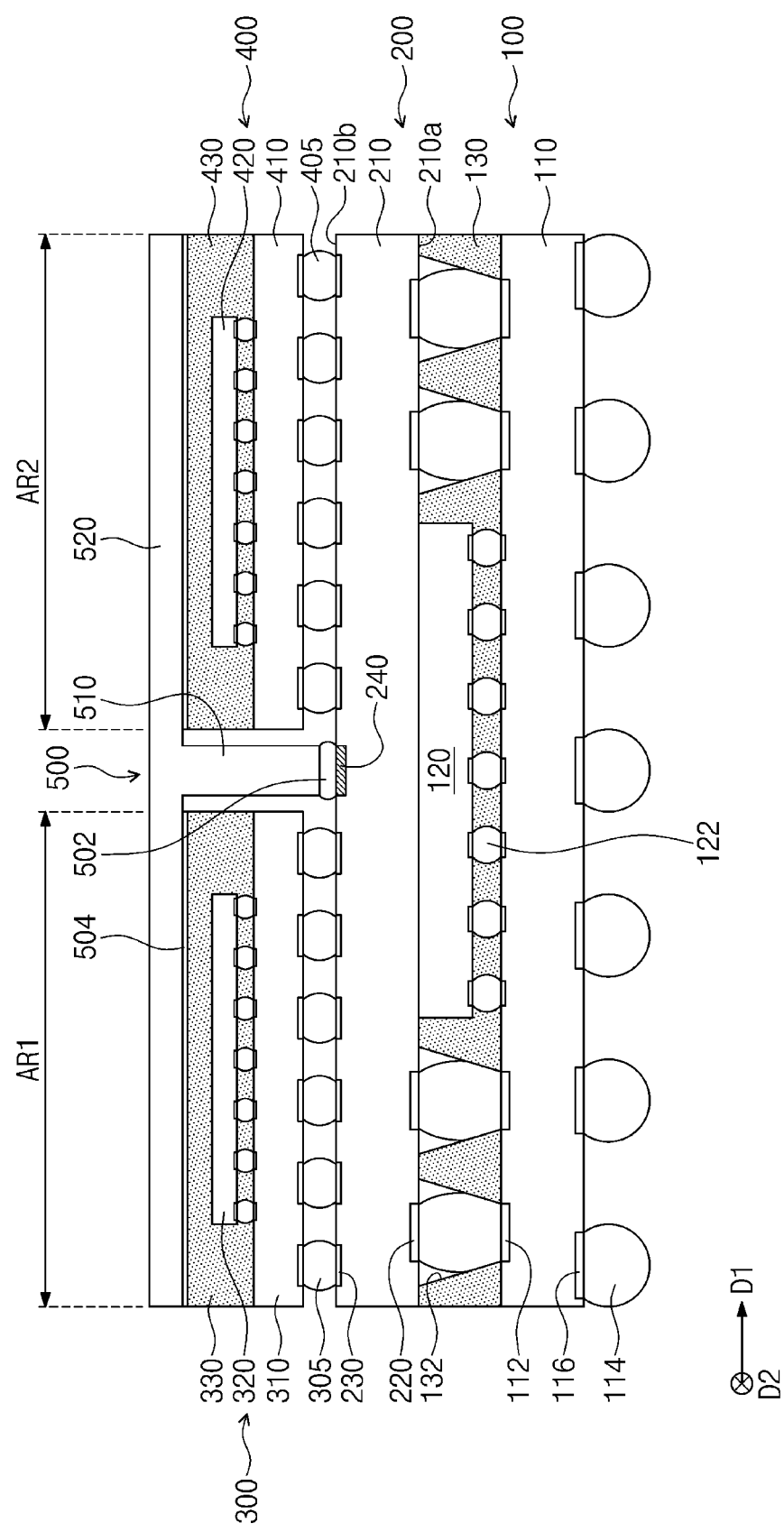
FIG. 5 is a cross-sectional view of another example of a semiconductor package according to the present inventive concepts.
Figure 6:
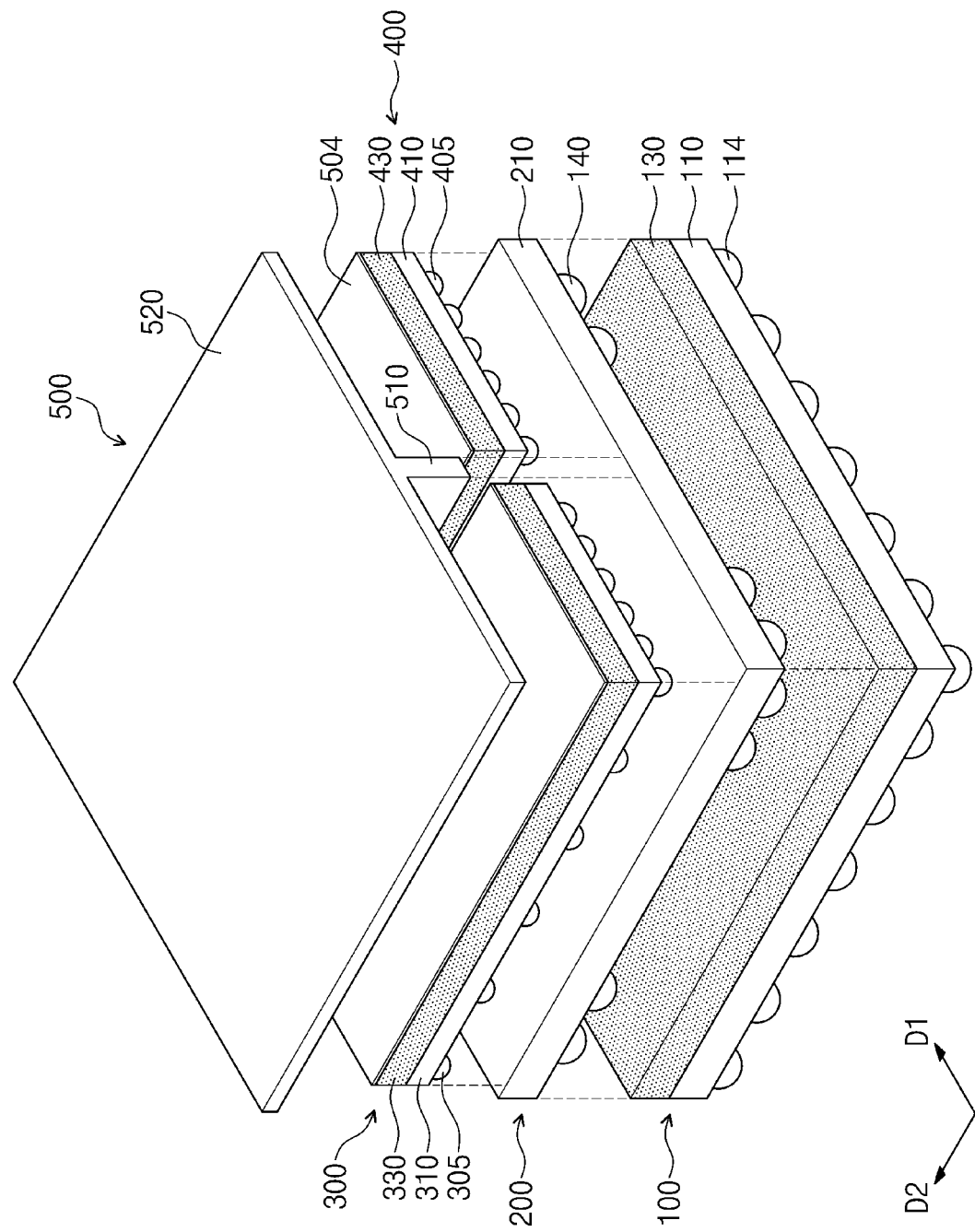
FIG. 6 illustrates an exploded perspective view of the semiconductor package of FIG. 5.
Figure 7:
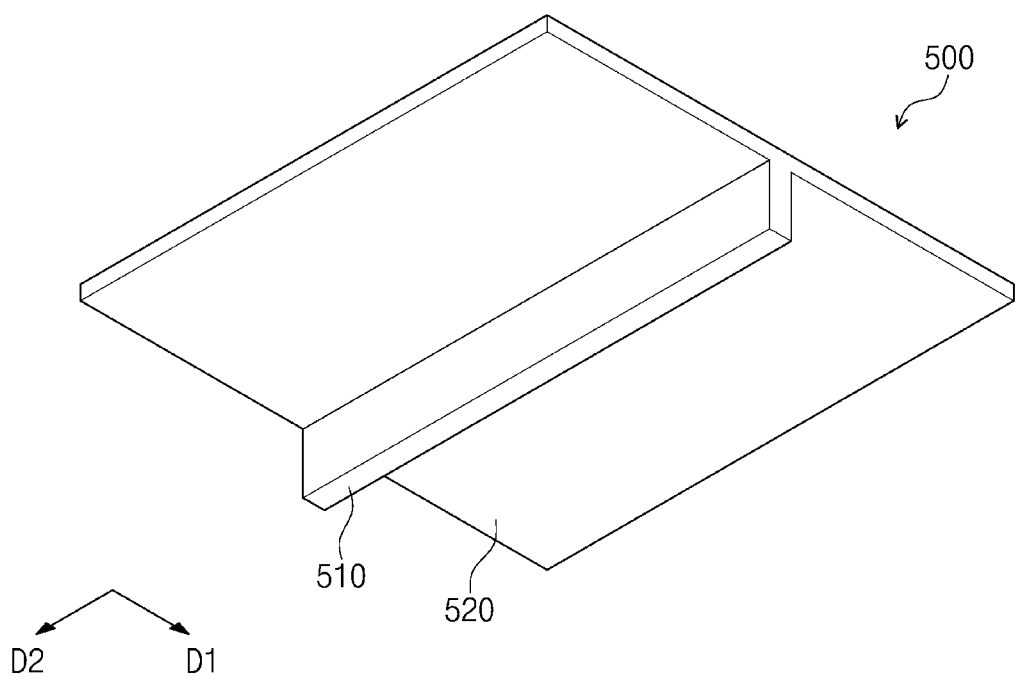
FIG. 7 is a perspective view of a heat spreader of the semiconductor package of FIG. 5.

FIG. 5 is a cross-sectional view of another example of a semiconductor package according to the present inventive concept. FIG. 6 is an exploded perspective view of the semiconductor package with some components omitted for ease of illustration. FIG. 7 is a perspective view of a heat transmitter of the semiconductor package. In the description that follows, components which are the same as those discussed with reference to FIGS. 1 and 2 are allocated with the same reference numerals, and a description thereof will be omitted or abridged for the sake of brevity. The following mainly describes differences between the example of FIGS. 1 and 2 and other examples described below.

Referring to FIGS. 5 to 7, the heat spreader 500 may extend onto a top surface of the first top package 300 and a top surface of the second top package 400. For example, the heat spreader 500 may include a partition wall segment 510 between the first and second top packages 300 and 400 and an extension segment 520 extending from an upper end of the partition wall segment 510. The extension segment 520 may extend from an upper portion of the heat spreader 500 onto an imaginary plane parallel to the first and second directions D1 and D2. For example, the extension segment 520 of the heat spreader 500 may wholly cover the top surfaces of the first and second top packages 300 and 400. The extension segment 520 of the heat spreader 500 may absorb and conduct heat generated in the first and second top packages 300 and 400 radially outwardly.

A thermal transfer material layer 504 may be provided between the extension segment 520 and the top surface of the first top package 300 and/or between the extension segment 520 and the top surface of the second top package 400. The thermal transfer material layer 504 may include a thermal interface material (TIM) such as thermal grease. The extension segment 520 may effectively conduct heat generated in the first and second top packages 300 and 400 radially outwardly through the thermal transfer material layer 504.

According to this example of the inventive concept, the heat spreader 500 may effectively transfer heat because the extension segment 520 has a relatively large area. In addition, the extension segment 520 of the heat spreader 500 may contact the first and second top packages 300 and 400, and absorb and conduct heat generated in the first and second top packages 300 and 400 radially outwardly. As a result, the semiconductor package has a very high degree of thermal stability.

Figure 8:
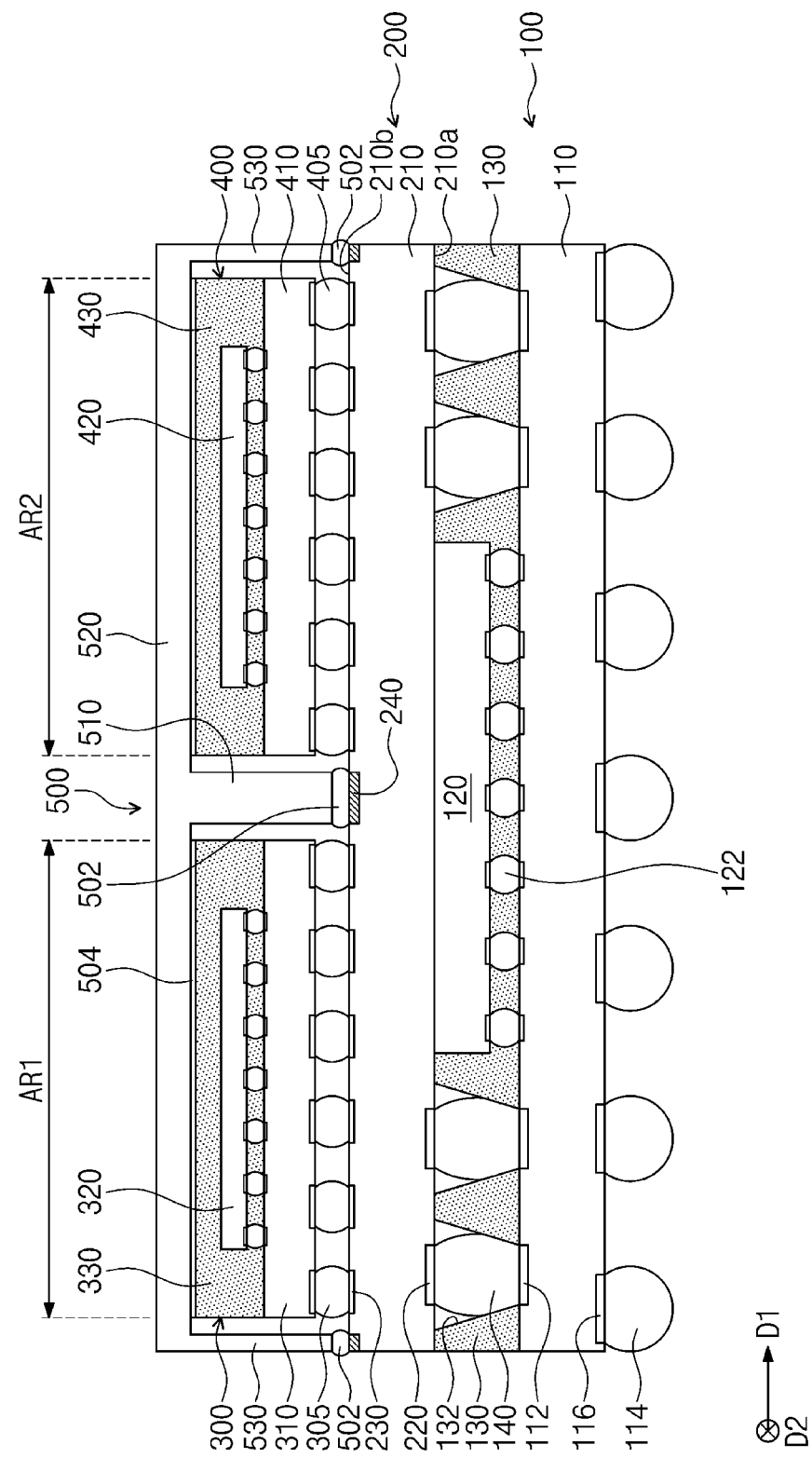
FIG. 8 is a cross-sectional view of still another example of a semiconductor package according to the present inventive concept.
Figure 9:
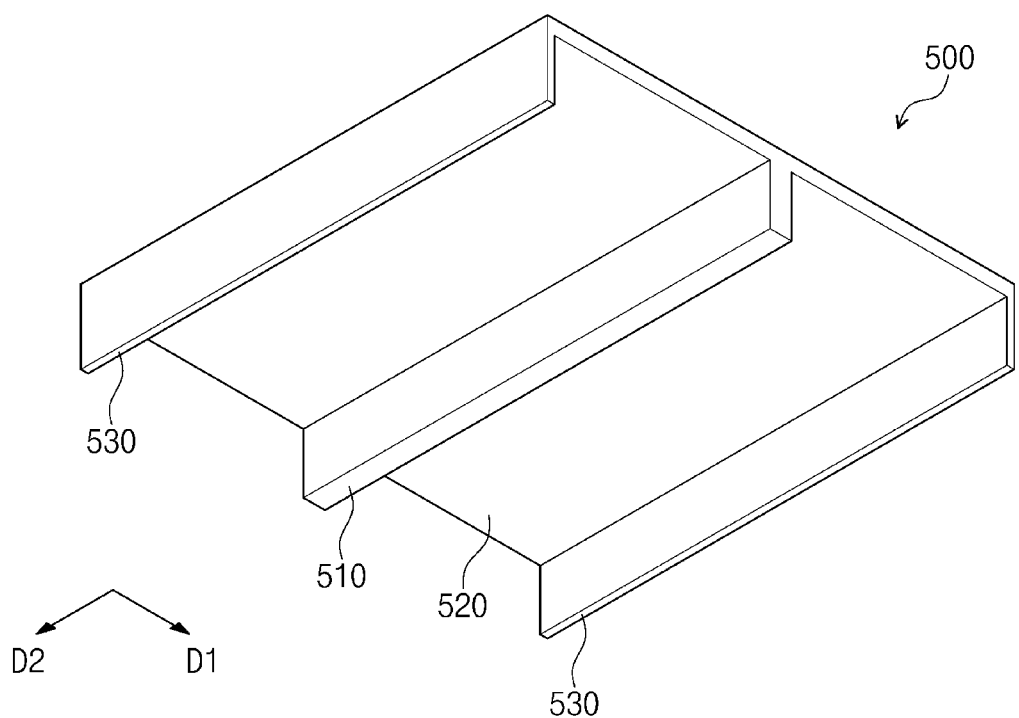
FIGS. 9 and 10 are perspective views of examples of a heat spreader of the semiconductor package of FIG. 8.
Figure 10:
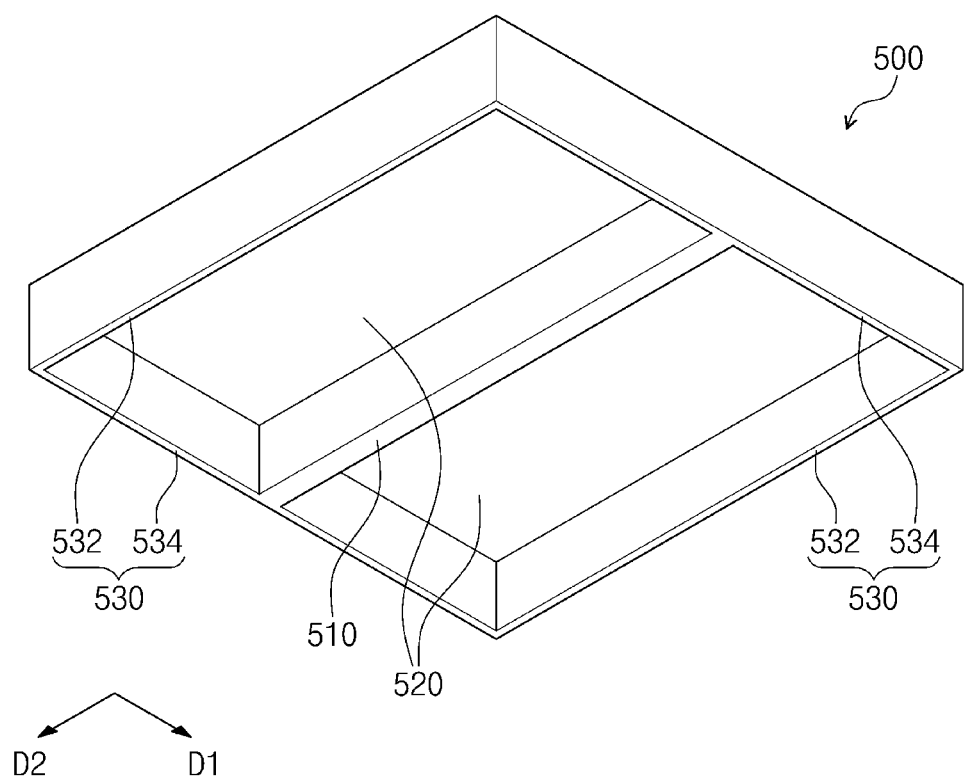

FIG. 8 is a cross-sectional view of another example of a semiconductor package according to the present inventive concept. FIGS. 9 and 10 are perspective views showing examples of a heat transmitter of the semiconductor package. Referring to FIGS. 8 to 10, the heat spreader 500 may extend onto a lateral surface of the first top package 300 and onto a lateral surface of the second top package 400. For example, the heat spreader 500 may include the partition wall segment 510 between the first and second top packages 300 and 400 and the extension segment 520 extending from an upper end of the partition wall segment 510, and further include a side wall segment 530 covering the lateral surfaces of the first and second top packages 300 and 400 along an edge of the interposer 200. The side wall segment 530 may have a partition wall shape that extends parallel to the partition wall segment 510 and downward from opposite edges of the extension segment 520. As illustrated in FIG. 9, the side wall segment 530 may be provided on opposite sides in the first direction D1 of the extension segment 520. In this case, the side wall segment 530 may cover lateral surfaces of the first and second top packages 300 and 400, which lateral surfaces extend in the second direction D2. As illustrated in FIG. 10, the side wall segment 530 may include a first side segment 532 and a second side segment 534. The first side segment 532 may be provided on opposite sides in the first direction D1 of the extension segment 520, and the second side segment 534 may be provided on opposite sides in the second direction D2 of the extension segment 520. In this case, the first side segment 532 may cover lateral surfaces extending in the second direction D2 of the first and second top packages 300 and 400, and the second side segment 534 may cover lateral surfaces extending in the first direction D1 of the first and second top packages 300 and 400. The side wall segment 530 may be mounted on the interposer 200 through the second connection terminals 502. For example, the side wall segment 530 may be coupled through the second connection terminals 502 to the third part 246 of the third circuit pattern 240. The second connection terminals 502 may electrically connect the side wall segment 530 to the third circuit pattern 240 of the interposer 200, and may rigidly adhere the heat spreader 500 to the interposer 200. Alternatively, the side wall segment 530 may be adhered to the interposer 200 through a conductive adhesion pattern.

According to the above-described examples of the inventive concept, the heat spreader 500 may cover lateral and top surfaces of the first top package 300 and lateral and top surfaces of the second top package 400. The heat spreader 500 including a metallic material may shield the first and second top packages 300 and 400 thus prevent electromagnetic interference (EMI). For example, the heat spreader 500 may shield electromagnetic waves externally applied to or emitted from the first and second top packages 300 and 400. The heat spreader 500 may be electrically grounded through the third circuit pattern 240 and a ground circuit of the interposer 200. The electromagnetic waves may be absorbed by the heat spreader 500 and then transmitted radially outwardly through the ground circuit of the interposer 200. As a result, the semiconductor package may possess excellent electrical characteristics.

Figure 11:
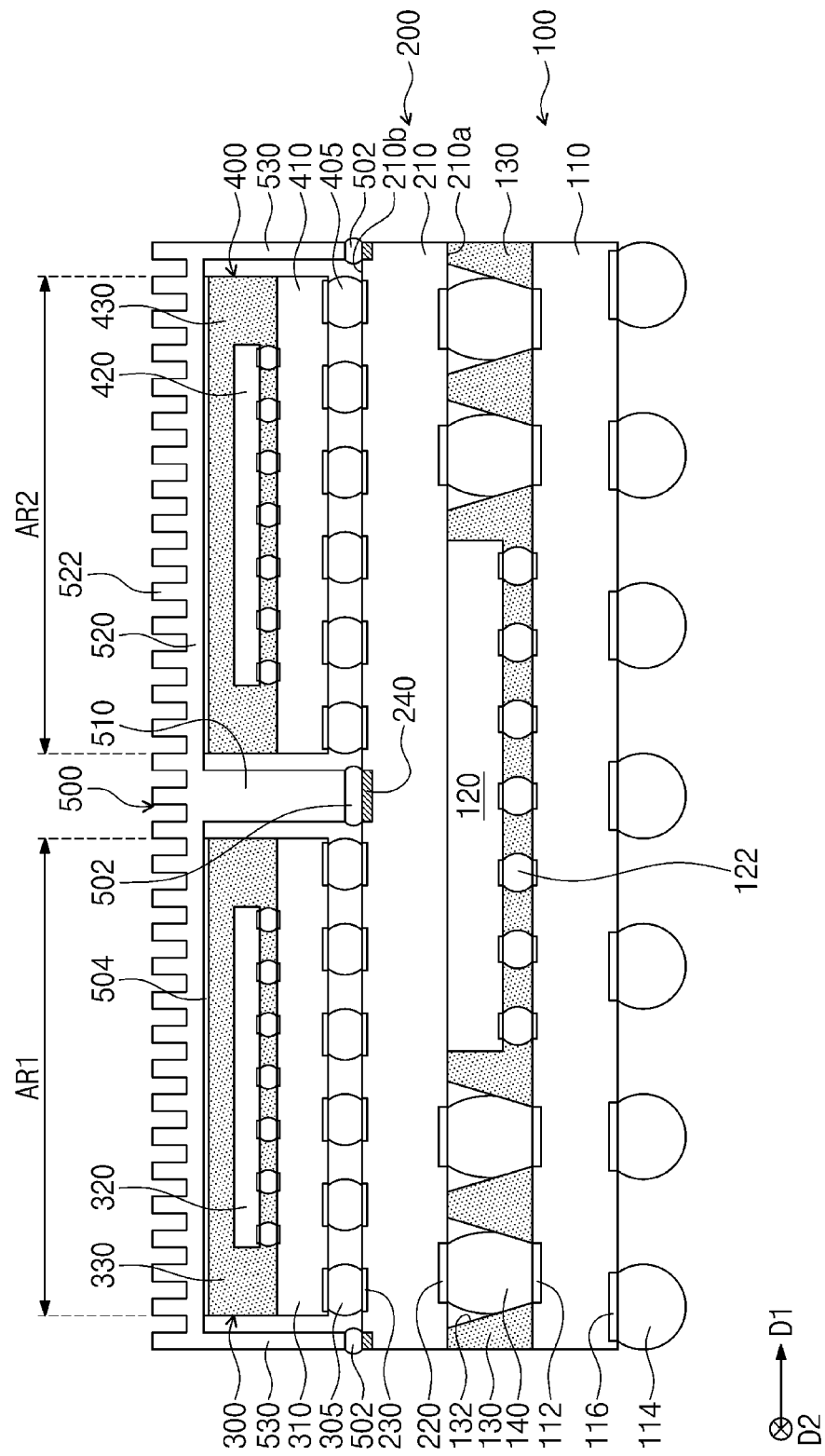
FIG. 11 is a cross-sectional view of another example of a semiconductor package according to the present inventive concept.

FIG. 11 is a cross-sectional view of another example of a semiconductor package according to the present inventive concept. As illustrated in FIG. 11, the heat spreader 500 includes heat radiation fins 522 on a top surface of the extension segment 520. Each of the heat radiation fins 522 may protrude from the top surface of the extension segment 520. The heat radiation fins 522 may be spaced apart from each other in the first direction D1 and may extend lengthwise in the second direction D2.

According to the above-described example of the inventive concept, the heat spreader 500 has an especially large surface-to-air contact area due to the provision of the heat radiation fins 522. The heat spreader 500 may thus dissipate heat efficiently from the top surface of the extension segment 520.

Figure 12:
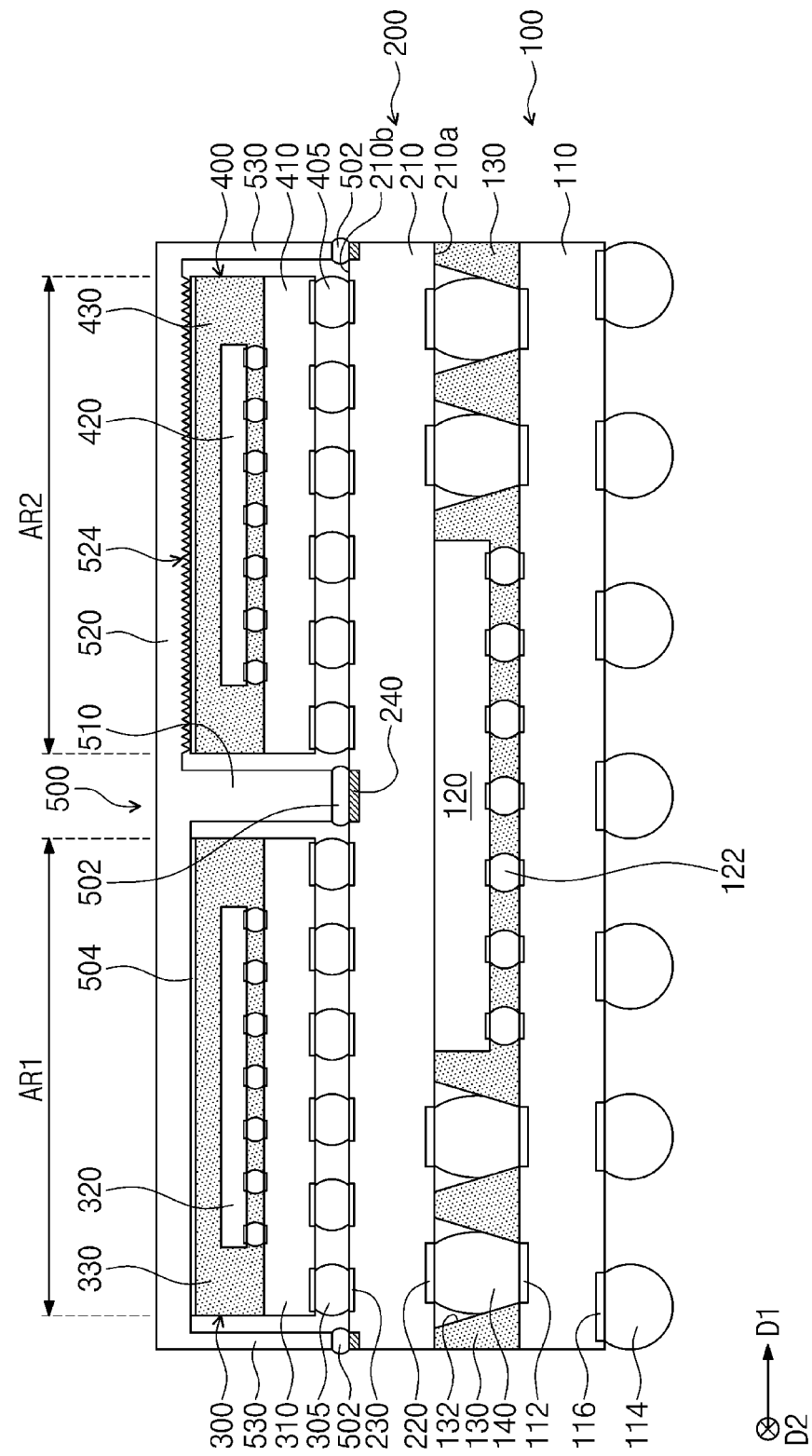
FIG. 12 is a cross-sectional view of another example of a semiconductor package according to the present inventive concept.

FIG. 12 is a cross-sectional view of still another example of a semiconductor package according to the present inventive concept. As illustrated in FIG. 12, the heat spreader 500 includes protrusions 524 between the extension segment 520 and the second top package 400. Each of the protrusions 524 may protrude from the extension segment 520 toward the second top package 400. For example, each of the protrusions 524 may have a wedge shape whose width decreases as distance from a bottom surface of the extension segment 520 increases. Alternatively, each of the protrusions 524 may have a rectangular parallelepiped shape or a hemispherical shape.

According to the above-described example of the inventive concept, the protrusions 524 allow the heat spreader 500 to have a small area in contact with the second top package 400. It is therefore likely that heat transfer hardly occurs between the heat spreader 500 and the second top package 400. When the first top package 300 generates more heat than the second top package 400, the protrusions 524 may prevent heat generated in the first top package 300 from transferring to the second top package 400. That is, the first and second upper semiconductor chips 320 and 420 may be prevented from being damaged due to a heat imbalance between the first and second top packages 300 and 400.

Figure 13:
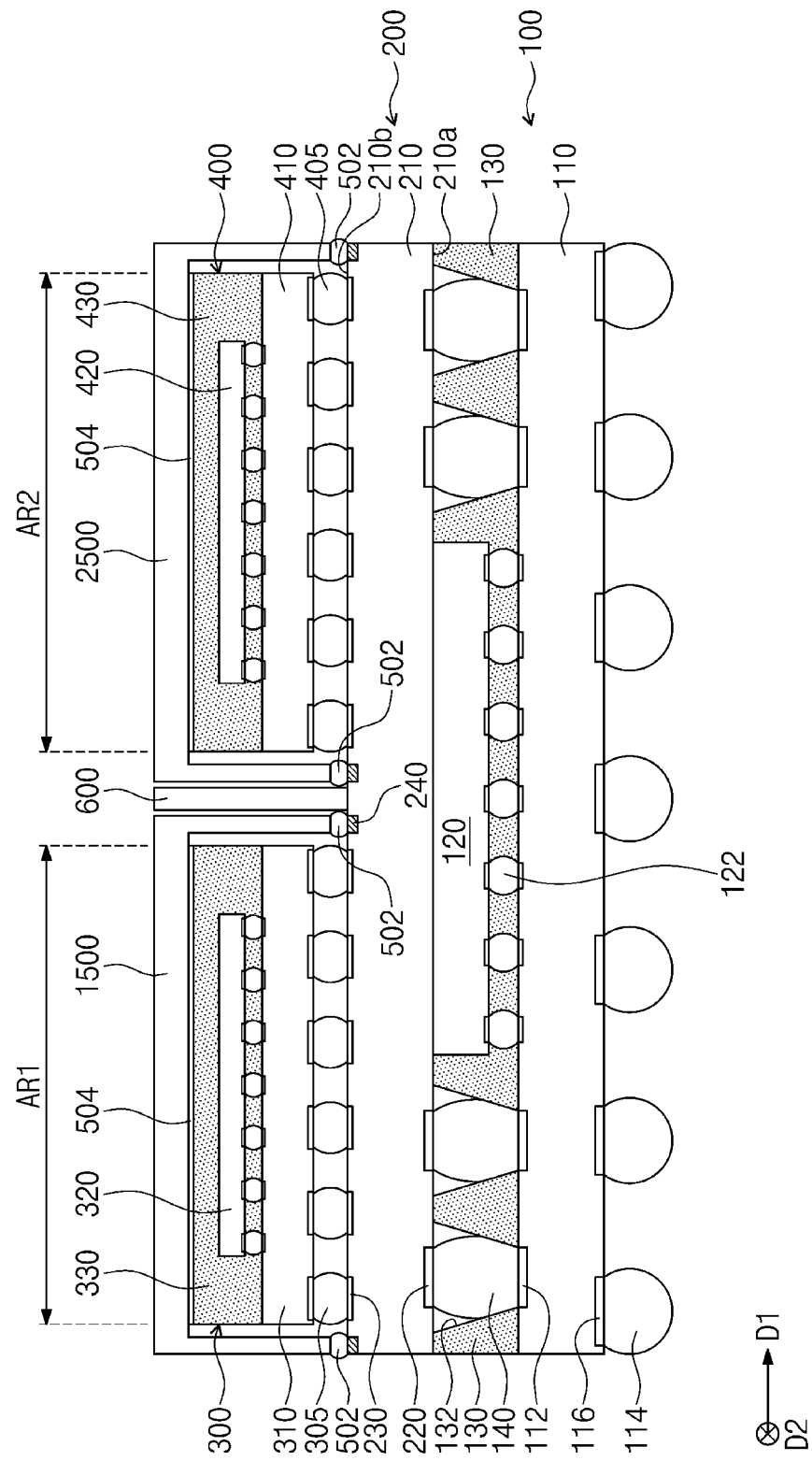
FIG. 13 is a cross-sectional view of another example of a semiconductor package according to the present inventive concept.

FIG. 13 is a cross-sectional view of another example of a semiconductor package according to the present inventive concept. As illustrated in FIG. 13, heat distribution structure including a plurality of heat spreaders is provided. The heat spreaders may include a first heat spreader 1500 and a second heat spreader 2500. The first heat spreader 1500 may cover the first top package 300, and the second heat spreader 2500 may cover the second top package 400. The first and second heat spreaders 1500 and 2500 may be coupled through the second connection terminals 502 to the third circuit pattern 240 of the interposer 200. The first heat spreader 1500 may spread heat generated in the bottom package 100 and the first top package 300, and the second heat spreader 2500 may spread heat generated in the bottom package 100 and the second top package 400. The first heat spreader 1500 may shield the first top package 300 from external electromagnetic waves, and the second heat spreader 2500 may shield the second top package 400 from external electromagnetic waves, thereby preventing electromagnetic interference (EMI). To this end, the first and second heat spreaders 1500 and 2500 may be coupled to corresponding ground circuits of the interposer 200. Electromagnetic waves may be absorbed by the first and second heat spreaders 1500 and 2500 and then outwardly discharged through the ground circuits. The ground circuits coupled to the first and second heat spreaders 1500 and 2500 may be electrically independent of, i.e., electrically isolated from, each other. Thus, each of the first and second heat spreaders 1500 and 2500 may shield a corresponding one of the first and second top packages 300 and 400. An insulation layer 600 may be provided between the first and second heat spreaders 1500 and 2500.

According to an aspect of the inventive concept, the first and second heat spreaders 1500 and 2500 may be respectively provided on the first and second top packages 300 and 400. In such a configuration, heat transfer between the first and second top packages 300 and 400 may be prevented, and the first and second upper semiconductor chips 320 and 420 may be free of damage. In addition, the first and second top packages 300 and 400 may be individually protected from electromagnetic interference (EMI), and thus a semiconductor package as described above may have excellent electrical characteristics and reliability.

Figure 14:
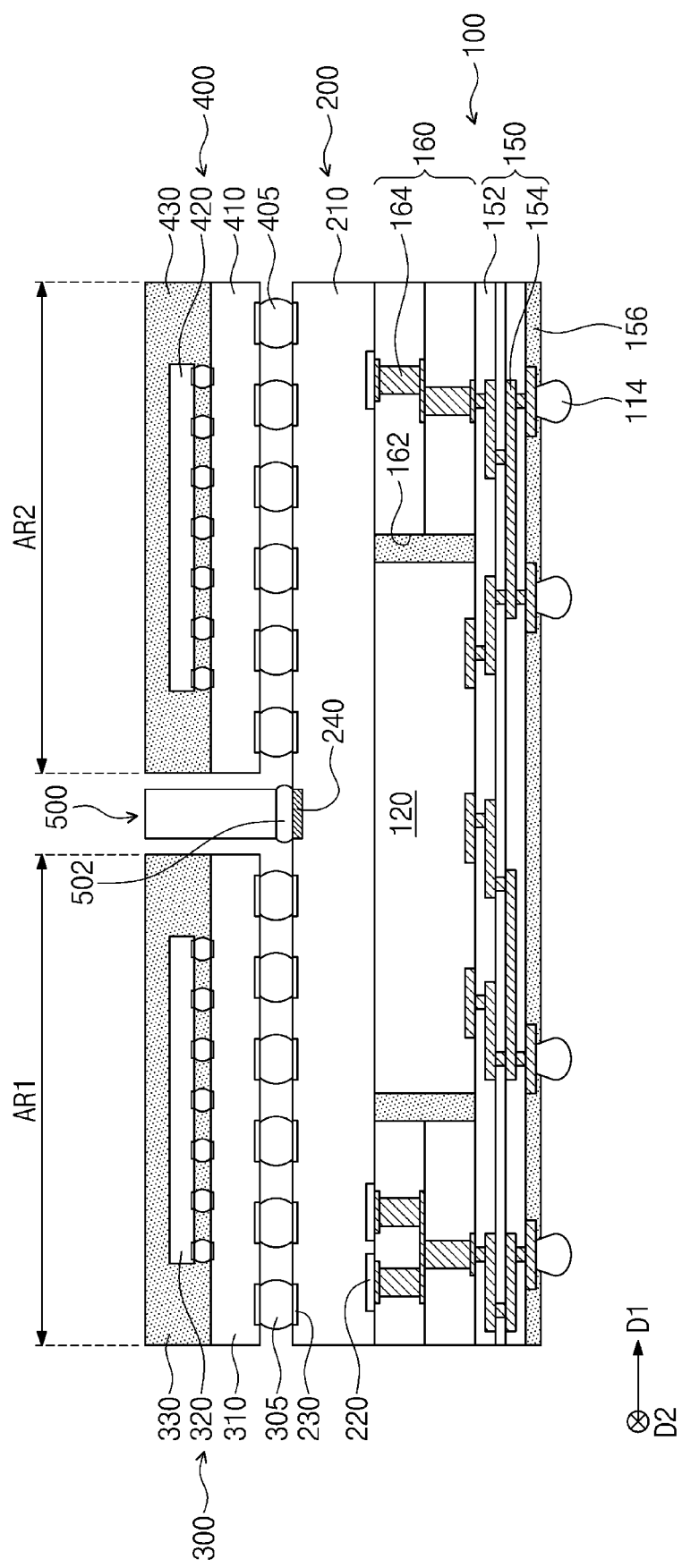
FIG. 14 is a cross-sectional view of yet another example of a semiconductor package according to the present inventive concept.

FIG. 14 is a cross-sectional view of still another example of a semiconductor package according to the present inventive concept. As illustrated in FIG. 14, the bottom package 100 has a fan-out structure. For example, the bottom package 100 may include a redistribution substrate 150 as a lower package substrate, an interconnect substrate 160, and a lower semiconductor chip 120.

The redistribution substrate 150 may include insulating patterns 152 (constituting a "body" of the redistribution substrate) and conductive patterns 154. The conductive patterns 154 may distribute the signals to and from the lower semiconductor chip 120 mounted on the redistribution substrate 150. A passivation layer 156 may be disposed on a bottom surface of the redistribution substrate 150. The external terminals 114 may be provided on the bottom surface of the redistribution substrate 150. The external terminals 114 may be electrically connected to the conductive patterns 154.

The interconnect substrate 160 may be disposed on the redistribution substrate 150. The interconnect substrate 160 may have a hole 162 extending therethrough. When viewed in plan, the hole 162 may have a shape corresponding to that of the lower semiconductor chip 120. The interconnect substrate 160 may include a conductive via 164 in the interconnect substrate 160. The conductive via 164 may extend through the interconnect substrate 160 and electrically connect the redistribution substrate 150 to the first circuit pattern 220 of the interposer 200.

The lower semiconductor chip 120 may be disposed on the redistribution substrate 150 within the hole 162 of the interconnect substrate 160. The lower semiconductor chip 120 may have a bottom surface in contact with a top surface of the redistribution substrate 150, and may be electrically connected to the conductive patterns 154 of the redistribution substrate 150.

Although certain features have been described exclusively with respect to each of the examples of FIGS. 5 to 14, it will be readily apparent that such features of the examples may be used in combination in accordance with the present inventive concept. In addition, a semiconductor package according to the present inventive concept is not limited to possessing only the features shown in any one example, but rather may be configured in various ways. For example, semiconductor package according to the present inventive concept may incorporate various features from more than one of the examples of the heat distribution structure.

FIGS. 15 to 20 show a method of fabricating a semiconductor package according to the present inventive concepts. The following mainly describes a method of fabricating the semiconductor package shown in FIG. 8, but the inventive concept is not limited thereto as the method may be applied to fabricating any semiconductor package having heat distribution structure according to the present inventive concept.

Figure 15:
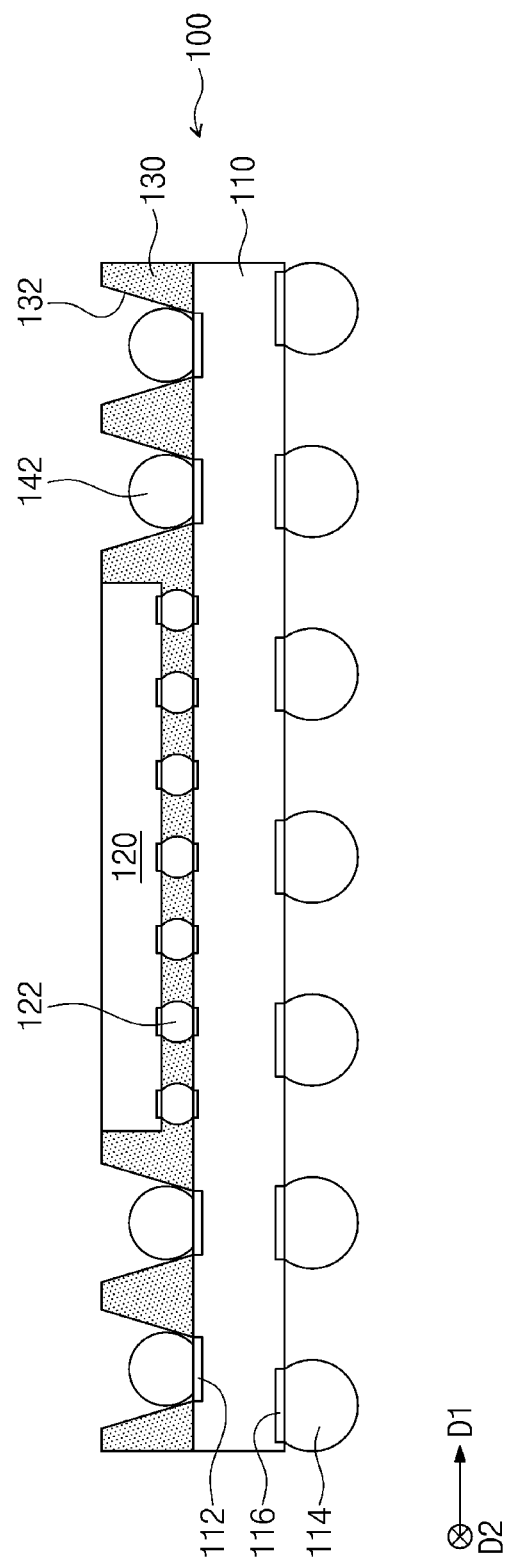
FIGS. 15, 16, 17, 18, 19 and 20 are cross-sectional views of an example of a semiconductor package during the course of its manufacture and together illustrate a method of fabricating a semiconductor package according to the present inventive concept.

Referring to FIG. 15, a bottom package 100 may be provided. The bottom package 100 may include a lower package substrate 110, a lower semiconductor chip 120 mounted on the lower package substrate 110, a lower mold layer 130 encapsulating the lower semiconductor chip 120, and first solder balls 142 provided in connection holes 132 of the lower mold layer 130. In this description, the term "solder" may mean a conductor (e.g., tin, gold, silver, or copper) or an alloy thereof (e.g., Sn—Ag, Sn—In, Sn—Au, Sn—Cu, or Sn—Bi), and the term "solder ball" may indicate a spherical or similar shaped conductor.

Figure 16:
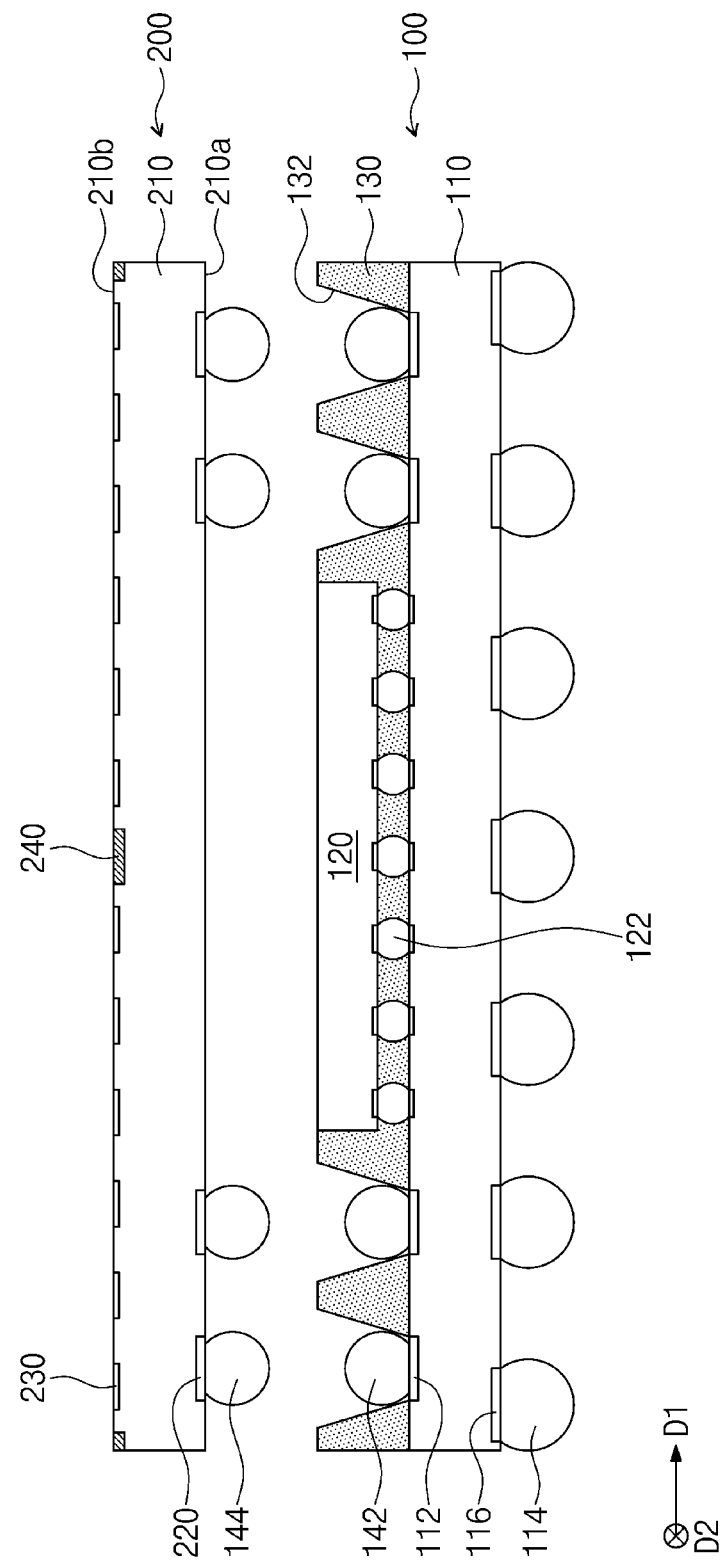

Referring to FIG. 16, an interposer 200 may be provided. The interposer 200 may include a base layer 210, a first circuit pattern 220 formed on a bottom surface 210a of the base layer 210, and second and third circuit patterns 230 and 240 on a top surface 210b of the base layer 210. Second solder balls 144 may be provided on the first circuit pattern 220.

Figure 17:
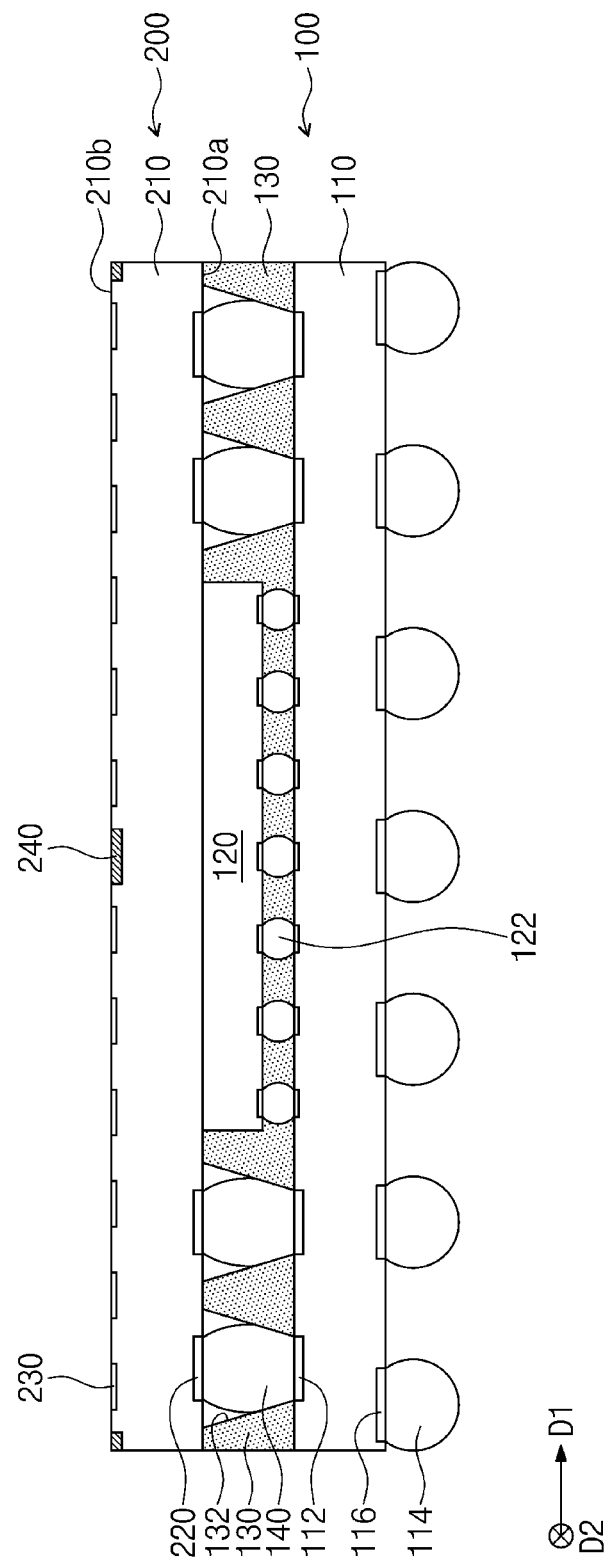

Referring to FIG. 17, the interposer 200 may be mounted on the bottom package 100. For example, the interposer 200 may be aligned with the bottom package 100 in such a way that the first solder balls 142 are provided in one-to-on correspondence with the second solder balls 144. The first and second solder balls 142 and 144 may be combined to form first connection terminals 140. A reflow process may be performed to form the first connection terminals 140. The interposer 200 may be in contact with a top surface of the lower semiconductor chip 120 and a top surface of the lower mold layer 130.

Figure 18:
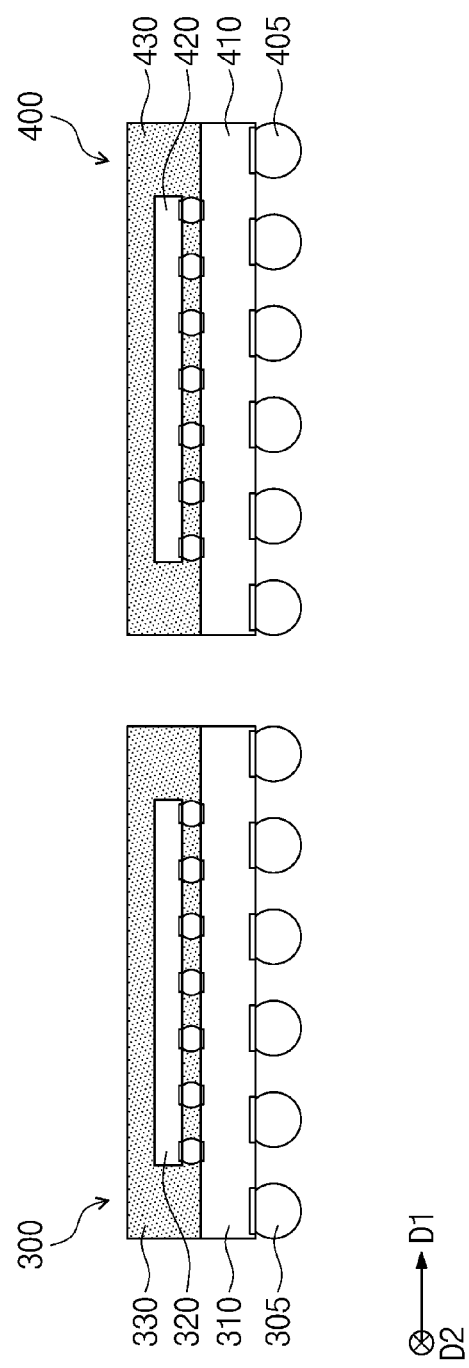

Referring to FIG. 18, first and second top packages 300 and 400 may be provided. The first top package 300 may include a first upper package substrate 310, a first upper semiconductor chip 320 mounted on the first upper package substrate 310, a first upper mold layer 330 covering the first upper semiconductor chip 320, and first upper contact terminals 305 provided on a bottom surface of the first upper package substrate 310. The second top package 400 may include a second upper package substrate 410, a second upper semiconductor chip 420 mounted on the second upper package substrate 410, a second upper mold layer 430 covering the second upper semiconductor chip 420, and second upper contact terminals 405 provided on a bottom surface of the second upper package substrate 410.

Figure 19:
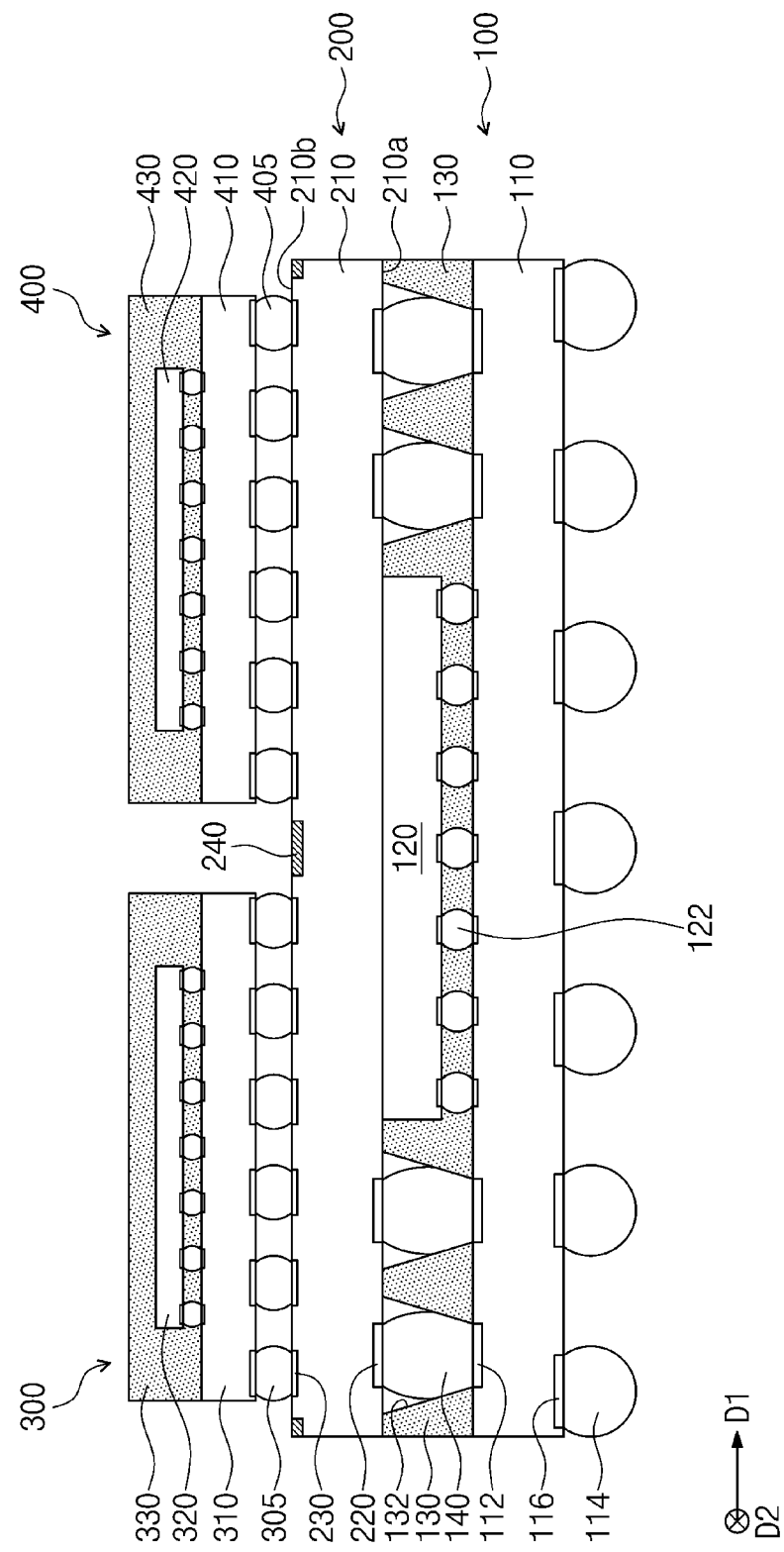

Referring to FIG. 19, the first and second top packages 300 and 400 may be mounted on the interposer 200. For example, the first and second top packages 300 and 400 may be aligned with the interposer 200 in such a way that the first upper contact terminals 305 may be situated over one portion of the second circuit pattern 230, and the second upper contact terminals 405 may be situated over another portion of the second circuit pattern 230. A reflow process may be performed such that the first upper contact terminals 305 may be coupled to the one portion of the second circuit pattern 230, and the second upper contact terminals 405 may be coupled to the another portion of the second circuit pattern 230.

Figure 20:
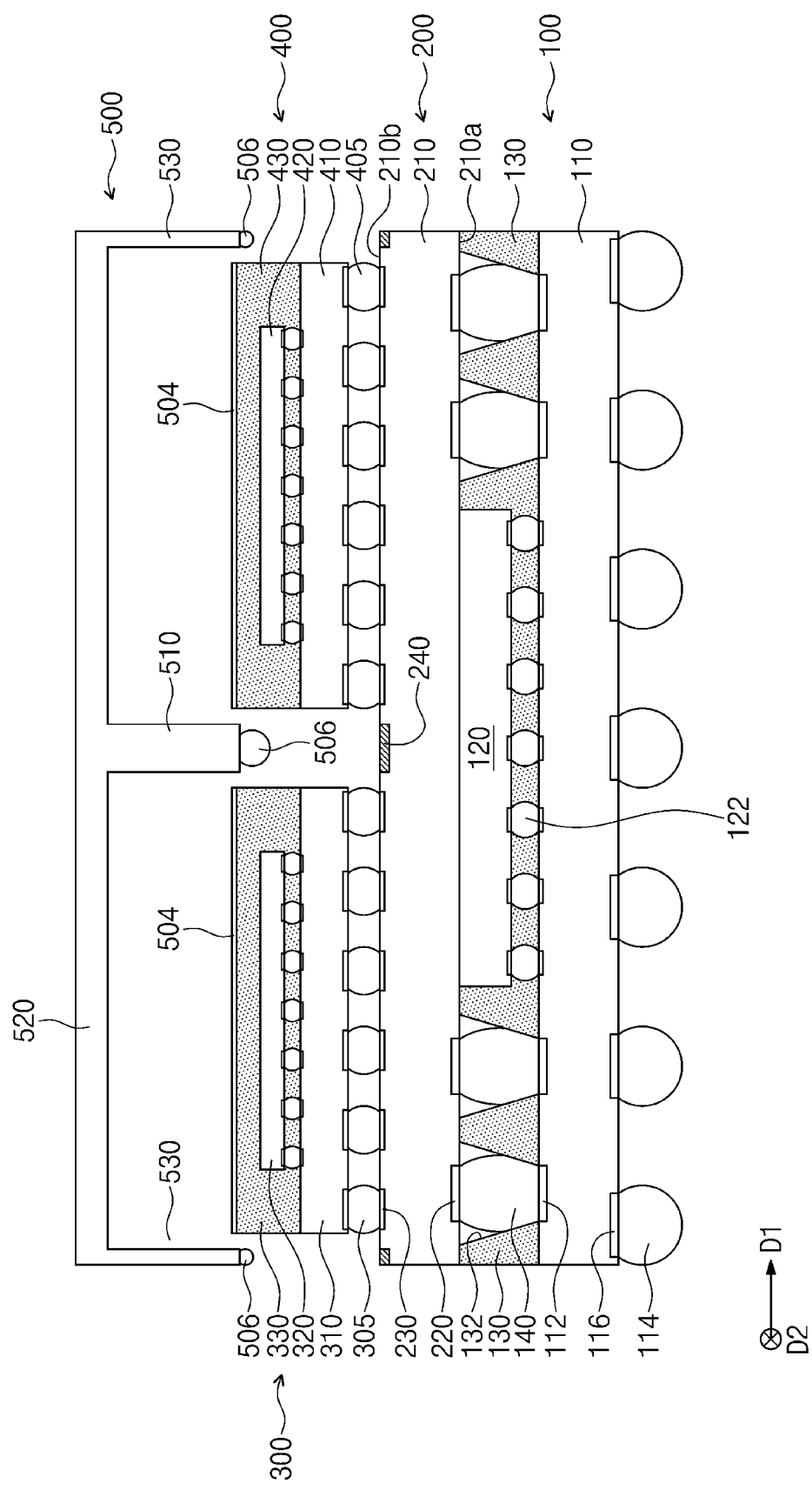

Referring to FIG. 20, a heat spreader 500 may be provided on the first and second top packages 300 and 400. The heat spreader 500 may include a partition wall segment 510 extending in a second direction D2, an extension segment 520 extending from an upper portion of the partition wall segment 510 onto an imaginary plane parallel to the first and second directions D1 and D2, and a side wall segment 530 disposed on an outer periphery of the extension segment 520. Third solder balls 506 may be provided on a lower end of the partition wall segment 510 and a lower end of the side wall segment 530.

Referring to FIG. 8, the heat spreader 500 may be mounted on the interposer 200. For example, the heat spreader 500 may be aligned with the interposer 200 in such a way that the third solder balls 506 may be situated over the third circuit pattern 240. The third solder balls 506 may be combined with the third circuit pattern 240, and thus second connection terminals 502 may be formed. A reflow process may be performed to form the second connection terminals 502.

Alternatively, a conductive adhesion pattern may be used to adhere the heat spreader 500 to the interposer 200. For example, the conductive adhesion pattern may be provided on the lower end of the partition wall segment 510 and the lower end of the side wall segment 530. The conductive adhesion pattern may include a thermal interface material (TIM) such as thermal grease.

According to the present inventive concept, the heat spreader 500 may be fabricated in advance, and then a soldering process or a conductive adhesion pattern may be used to mount the heat spreader 500 to the interposer 200. As such, the heat spreader 500 may be simply mounted on the interposer 200, and the first and second top packages 300 and 400 may be rarely damaged when the heat spreader 500 is mounted.

According to the present inventive concept as described above, a semiconductor package has heat distribution structure having high thermal conductivity, comprising a conductive pattern of an interposer substrate, and thus distributes heat generated in a lower semiconductor chip. Accordingly, the semiconductor package has a highly efficient heat dissipation characteristic, which characteristic may reduce heat transferred to first and second top packages and thereby present upper semiconductor chips of the top packages from being damaged. Accordingly, the semiconductor package has a high degree of thermal stability.

Furthermore, the heat spreader may prevent electromagnetic interference (EMI) between the first and second top packages. The heat spreader may absorb electromagnetic waves and then transit the electromagnetic waves outwardly of the package through a ground circuit. The semiconductor package may thus have excellent electrical characteristics.

Although the present embodiments have been described in connection with examples of the inventive concept illustrated in the accompanying drawings, it will be understood by one of ordinary skill in the art that variations in form and detail may be made to such examples without departing from the spirit and scope of the inventive concept. The above-described examples should thus be considered illustrative and not restrictive of the inventive concept.

What is claimed is:

1. A semiconductor package, comprising:
a bottom package including a lower package substrate and a semiconductor chip mounted on the lower package substrate;
an interposer on the bottom package, the interposer having a first region and a second region laterally spaced apart from each other;
a first top package on the first region of the interposer;
a first heat spreader covering a top surface of the first top package and surrounding lateral surfaces of the first top package;
a second top package on the second region of the interposer; and
a second heat spreader covering a top surface of the second top package and surrounding lateral surfaces of the second top package.

2. The semiconductor package of claim 1, further comprising a plurality of connection terminals on the interposer,
wherein the first heat spreader and the second heat spreader are adhered to the interposer through the plurality of connection terminals.

3. The semiconductor package of claim 2, wherein the interposer has an interposer body and ground circuits on the interposer body,
- the first heat spreader and the second heat spreader are coupled to the ground circuits of the interposer, respectively, and
- the ground circuits are electrically independent of each other.

4. The semiconductor package of claim 1, further comprising an insulation layer interposed between the first heat spreader and the second heat spreader.

5. The semiconductor package of claim 1, wherein the interposer comprises:
- an interposer body;
- a first circuit pattern on the interposer body and to which the first and second top packages are coupled; and
- a second circuit pattern on the interposer body and electrically insulated from the first circuit pattern in the semiconductor package, and
- the second circuit pattern extends from a central portion of the interposer body toward an outer peripheral portion of the interposer body when viewed in plan.

6. The semiconductor package of claim 5, wherein a top surface of the semiconductor chip is in contact with the interposer.

7. The semiconductor package of claim 1, wherein the first heat spreader and the second heat spreader each comprise an extension segment extending over a top surface of a respective one of the first and second top packages, and a plurality of heat radiation fins protruding upwardly from the extension segment and extending longitudinally parallel to each other in one direction.

* * * * *